US006114238A

United States Patent [19]

Liao

[11] Patent Number: 6,114,238

[45] Date of Patent: Sep. 5, 2000

[54] SELF-ALIGNED METAL NITRIDE FOR COPPER PASSIVATION

[75] Inventor: Kuan-Yang Liao, Taipei, Taiwan

[73] Assignee: United Silicon Incorporated, Taiwan

[21] Appl. No.: 09/082,388

[22] Filed: May 20, 1998

[30] Foreign Application Priority Data

Jan. 26, 1998 [TW] Taiwan ................................ 87101056

[51] Int. Cl.[7] ................................................ H01L 21/4763

[52] U.S. Cl. .......................... 438/648; 438/659; 438/687; 438/724; 438/775

[58] Field of Search .................................... 438/653, 687, 438/656, 643, 648, 658, 659, 660, 661, 724, 775

[56] References Cited

U.S. PATENT DOCUMENTS

| | | | |
|---|---|---|---|
| 5,447,887 | 9/1995 | Filipiak et al. | 437/200 |
| 5,470,789 | 11/1995 | Misawa | 437/190 |
| 5,674,787 | 10/1997 | Zhao et al. | 437/230 |
| 5,744,376 | 4/1998 | Chan et al. | 437/190 |
| 5,773,363 | 6/1998 | Derderian et al. | 438/672 |
| 5,793,112 | 8/1998 | Hasewaga et al. | 257/758 |
| 5,877,557 | 3/1999 | Zawaideh | 257/748 |

*Primary Examiner*—Wael Fahmy
*Assistant Examiner*—Kurt Eaton
*Attorney, Agent, or Firm*—Christie, Parker & Hale, LLP

[57] ABSTRACT

A method of fabricating metallization. A metal nitride layer is formed on the exposed surface of the metal layer. The metal nitride layer is used as a barrier layer to prevent short circuit, which is produced by metal diffusing into the inter-metal dielectrics. Therefore, the reliability of devices can be improved.

16 Claims, 2 Drawing Sheets

212a
208
206
202
200

SELF-ALIGNED METAL NITRIDE FOR COPPER PASSIVATION

CROSS-REFERENCE TO RELATED APPLICATION

This application claims priority benefit of Taiwan application Serial no. 87101056, filed Jan. 26, 1998, the full disclosure of which is incorporated herein by reference.

BACKGROUND OF THE INVENTION

1. Field of the Invention

The invention relates a method of fabricating metallization, and more particularly to a method of fabricating self-align metal nitride for copper passivation which can prevent short circuit between metal layers.

2. Description of the Related Art

FIG. 1 is a cross-sectional view of a structure of a conventional metallization. A substrate 100 having devices is provided and a dielectric layer 102 such as oxide is formed on the substrate 100. An opening is defined within the dielectric layer 102 and filled with a metal layer 104. In addition, a barrier layer 106 is formed on the opening. When copper is used as metal layer, copper will diffuse into the dielectric layer 102 when CVD is performed at a general temperature. Therefore a barrier layer 106 such as tantalum nitride (TaN) or tungsten nitride (WN) should be formed at the interface of dielectric layer 102 and copper 104. Diffusion from copper can be prevented by the barrier layer 106. In the conventional damascene process, an inter-metal dielectrics 108 is formed on the dielectric layer 102 after a planarization process is performed by chemical mechanical polishing (CMP). Metallization, for example, a metal plug 110 or a trench (not shown) is formed within the inter-metal dielectrics 108. However, there is no barrier layer formed on the upper surface of the metal line 104 to prevent diffusion of the copper as the deposition proceeds. So short circuit is produced by the dielectric layer 102 and inter-metal dielectrics 108 and the reliability of device decreases.

SUMMARY OF THE INVENTION

It is therefore an object of the invention to provide a metal nitride layer to cover the surface of the metal layer. The metal nitride layer is used as a barrier layer to prevent short circuit, which is produced by metal diffusing into the inter-metal dielectrics.

To achieve these objects and advantages, and in accordance with the purpose of the invention, as embodied and broadly described herein, the invention is directed towards a method of fabricating metallization. A substrate having devices is provided. A dielectric layer is formed on the substrate and defined to form an opening within the dielectric layer. A barrier layer is formed on the opening. A first metal layer is filled within the opening and then planarized. A nitride oxide layer and a metal layer containing nitrogen are formed by nitridation which use nitrogen to drive into the dielectric layer surface and the first metal layer surface. The nitride oxide layer is then removed. A second metal layer is formed on the substrate. The second metal layer and metal layer containing nitrogen react to form a metal nitride layer in a high temperature process. The unreacted second metal layer is removed and a metal nitride layer as a barrier layer covering the metal layer is accomplished.

It is to be understood that both the foregoing general description and the following detailed description are exemplary and explanatory only and are not restrictive of the invention, as claimed.

DESCRIPTION OF THE PREFERRED EMBODIMENTS

FIGS. 2A–2D schematically illustrate processing steps in the formation of metallization in accordance with preferred embodiments of the present invention.

Figure 1:
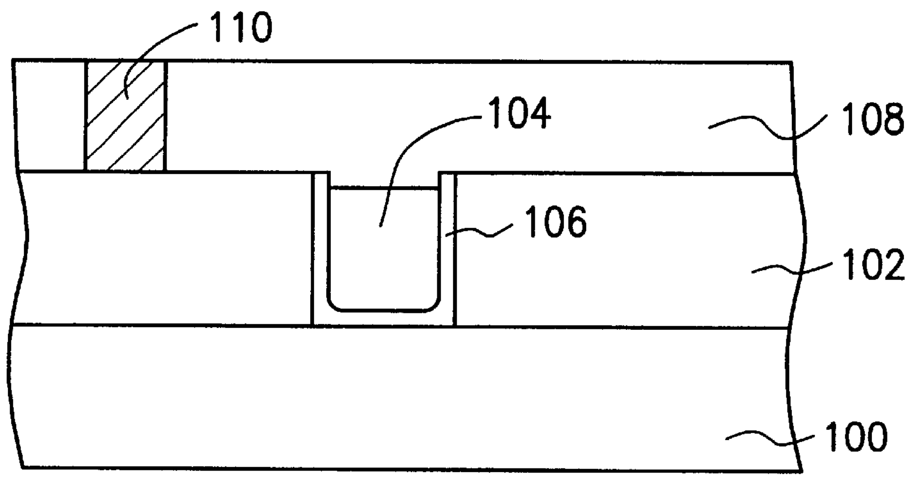
FIG. 1 is a cross sectional view of a structure of a conventional metallization.
Figure 2A:
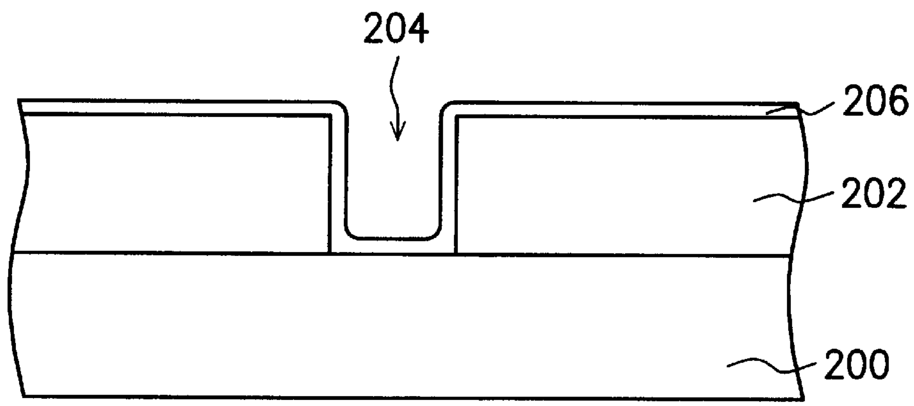
FIGS. 2A–2D schematically illustrate processing steps in the formation of metallization in accordance with preferred embodiments of the present invention.

Referring to FIG. 2A, a substrate 200 having devices (not shown) is provided and a dielectric layer 202 is formed on the substrate 200. The material of the dielectric layer 202 includes oxide. An opening 204 is patterned within the dielectric layer 202 by photolithography. In order to prevent the diffusion from copper to oxide, a first barrier layer 206 is formed on the dielectric layer 202 an the opening 204. The first barrier layer 206, including tantalum nitride (TaN) or tungsten nitride (WN), is formed by sputtering.

Figure 2B:
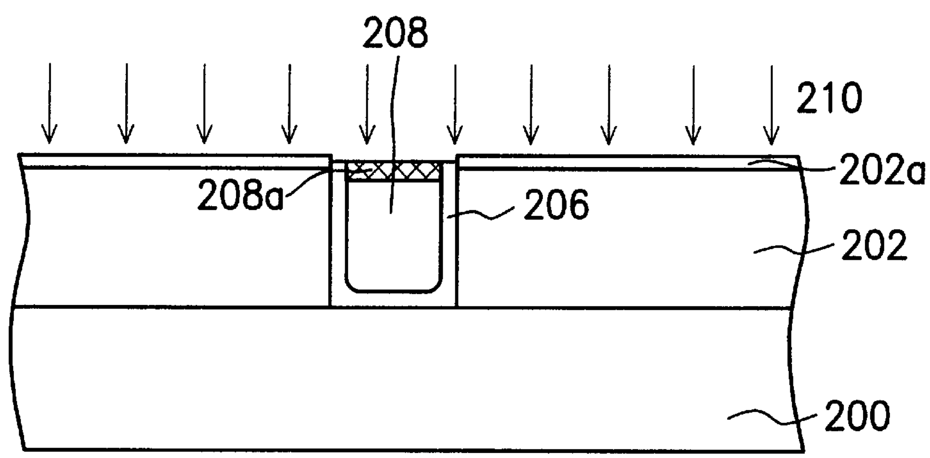

Referring to FIG. 2B, a first metal layer 208 such as copper is formed within the opening 204. The first barrier layer 206 is removed from the dielectric layer 202 and the first metal layer 208 is planarized by chemical mechanical polishing. A second barrier layer is then formed on the exposed surface of the first metal layer 208 and the second barrier layer isolates the first metal layer 208; the inter-metal dielectrics formed in the subsequent process. In the formation of the second barrier layer, a nitridation step is first performed. For example, plasma or implant (210) is used to drive $N_2$ into the exposed surface of the dielectric layer 202 and the first metal layer 208. A nitrogen oxide layer **202*a* is formed on the dielectric layer 202 surface and a metal layer 208*a* containing nitrogen is formed on the exposed surface of the first metal layer 208**. The energy dissipation to perform nitridation by plasma is in a range of about 100 to 500 eV, and the depth of nitridation is about 50 Å. The depth of nitridation by using implantation is about several hundred Å, and the energy dissipation is about 50 KeV. The thickness of the nitrogen oxide layer and the metal layer containing nitrogen depends on the degree of reaction.

Figure 2C:
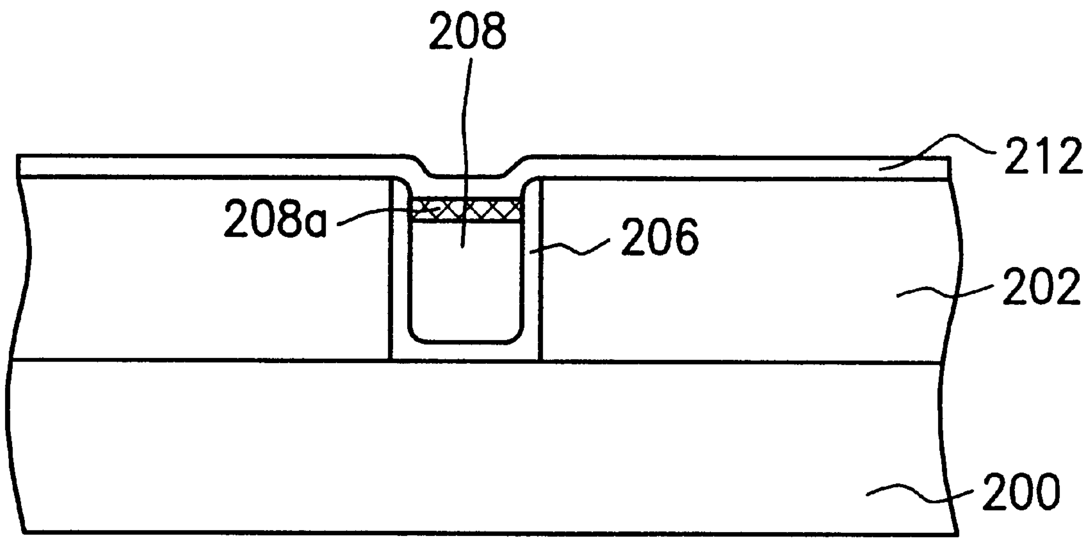
Figure 2D:
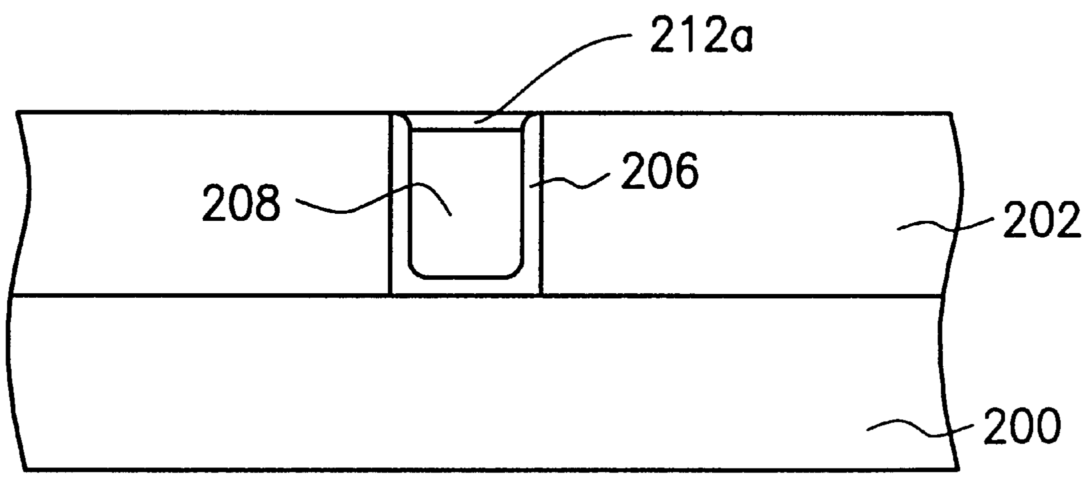

Referring to FIG. 2C, the nitrogen oxide layer **202*a* on the dielectric layer surface 202 is removed selectively by wet or dry etching. A second metal layer 212 is formed on the substrate 200 by sputtering. A high temperature process such as annealling makes the nitrogen in the nitrogen-containing metal layer 208*a* and the second metal layer 212 react. A metal nitride layer 212*a* is formed at the interface of the metal layer containing nitrogen 208*a* and the second metal layer 212, as shown in FIG. 2D. The reaction temperature, such as 400° C., is controlled until the metal nitride layer 212*a* formed. The second metal layer 212 includes tantalum, titanium or tungsten and the second metal layer 212*a* includes tantalum nitride (TaN), titanium nitride (TiN) or tungsten nitride. The metal layer 212, which doesn't react with nitrogen, is then removed from the surface of the dielectric layer 202** by wet etching. The structure of metallization is accomplished.

This invention is directed towards a method of fabricating metallization. A metal nitride layer is formed on the exposed surface of the metal layer. The metal nitride layer is used as a barrier layer to prevent short circuit, which is produced by metal diffusing into the inter-metal dielectrics. Therefore, the reliability of devices can be improved.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is a claimed is:

1. A method of fabricating a metallization, wherein a substrate having devices is provided and a dielectric layer is formed on the substrate comprising:

forming an opening within the dielectric layer;

forming a first barrier layer on the surface of the opening;

forming a first metal layer filled with the opening, planarizing the first metal layer to expose the dielectric layer;

performing a nitridation process over the substrate to form a nitrogen oxide layer on the dielectric layer surface and to form a metal layer containing nitrogen on the first metal layer;

removing the nitrogen oxide layer from the dielectric layer;

forming a second metal layer over the substrate; and making the second metal layer and the nitrogen in the metal layer containing nitrogen on the exposed surface of the first metal layer react to form a barrier metal nitride layer on the exposed first metal layer.

2. The method according to claim 1, wherein after forming the second barrier layer further comprises removing the unreacted second metal layer.

3. The method according to claim 1, wherein the nitridation process is performed by plasma.

4. The method according to claim 1, wherein the nitridation process is performed by plasma and the depth of nitridation is about 50 Å.

5. The method according to claim 4, wherein the energy dissipation of plasma is in a range of about 100 to 500 eV.

6. The method according to claim 1, wherein the nitridation process is performed by implantation.

7. The method according to claim 1, wherein he nitridation process is performed by implantation and the depth of nitridation is about several hundred Å.

8. The method according to claim 1, wherein the energy dissipation of implantation is in a range of about 50 KeV.

9. The method according to claim 1, wherein the second metal layer includes tantalum and the metal nitride layer includes tantalum nitride.

10. The method according to claim 1, wherein the second metal layer includes tungsten and the metal nitride layer includes tungsten nitride.

11. The method according to claim 1, wherein the second metal layer includes titanium and the metal nitride layer includes titanium nitride.

12. The method according to claim 1, wherein removing the nitrogen oxide layer is performed by wet etching.

13. The method according to claim 1, wherein removing the nitrogen oxide layer is performed by dry etching.

14. The method according to claim 1, wherein removing the unreacted second metal layer is performed by wet etching.

15. The method according to claim 1, wherein making the second metal layer and the metal layer containing nitrogen on the exposed surface of the first metal layer react further comprises a high temperature process.

16. The method according to claim 15, wherein the high temperature process is controlled at a temperature which is high enough to form the metal nitride layer.

* * * * *